(12) United States Patent
Lin et al.

(10) Patent No.: US 9,673,799 B2
(45) Date of Patent: Jun. 6, 2017

(54) SENSING CIRCUIT WITH REDUCED BIAS CLAMP

(71) Applicant: Taiwan Semiconductor Manufacturing Company, Ltd., Hsin-Chu (TW)

(72) Inventors: Ku-Feng Lin, New Taipei (TW); Hung-Chang Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/942,372

(22) Filed: Nov. 16, 2015

(65) Prior Publication Data

US 2016/0072494 A1    Mar. 10, 2016

Related U.S. Application Data

(62) Division of application No. 13/906,513, filed on May 31, 2013, now Pat. No. 9,214,931.

(60) Provisional application No. 61/787,614, filed on Mar. 15, 2013.

(51) Int. Cl.
   *H03K 5/24*    (2006.01)
   *G11C 7/06*    (2006.01)
   *G11C 13/00*   (2006.01)

(52) U.S. Cl.
   CPC ............ *H03K 5/2481* (2013.01); *G11C 7/062* (2013.01); *G11C 13/004* (2013.01); *G11C 2013/0054* (2013.01)

(58) Field of Classification Search
   CPC .............. G11C 11/4091; G11C 7/062; G11C 2207/063; G11C 11/24; G11C 16/28; G11C 13/004; G11C 2013/0054; G01R 19/00; H03F 2203/45551; H03K 5/2481
   See application file for complete search history.

(56) References Cited

U.S. PATENT DOCUMENTS

| | | |
|---|---|---|
| 5,734,276 A | 3/1998 | Abdi et al. |
| 2006/0170460 A1 | 8/2006 | Kawasumi |
| 2013/0314108 A1 | 11/2013 | Barnett et al. |
| 2014/0049291 A1 | 2/2014 | Soh et al. |

*Primary Examiner* — Jung Kim
(74) *Attorney, Agent, or Firm* — Slater Matsil, LLP

(57) ABSTRACT

A sensing circuit having a reduced bias clamp and method of operating the sensing circuit are provided. The sensing circuit may include a reference path and a sensing path. The sensing path may include a first transistor, clamping capacitor and a pair of switches. The reference path may include a second transistor, clamping capacitor and another pair of switches. A common gain stage receiving a bias voltage charges the clamping capacitors for the respective paths in a charging mode. The clamping capacitors may be charged in a serial or partially parallel manner during the charging mode. Each path may be coupled to a comparator, which may sense current or voltage changes between the paths during a sense mode. The sensing circuit may be configured to provide for sensing current or voltage changes between multiple sensing and/or reference paths in a parallel or serial manner.

20 Claims, 3 Drawing Sheets

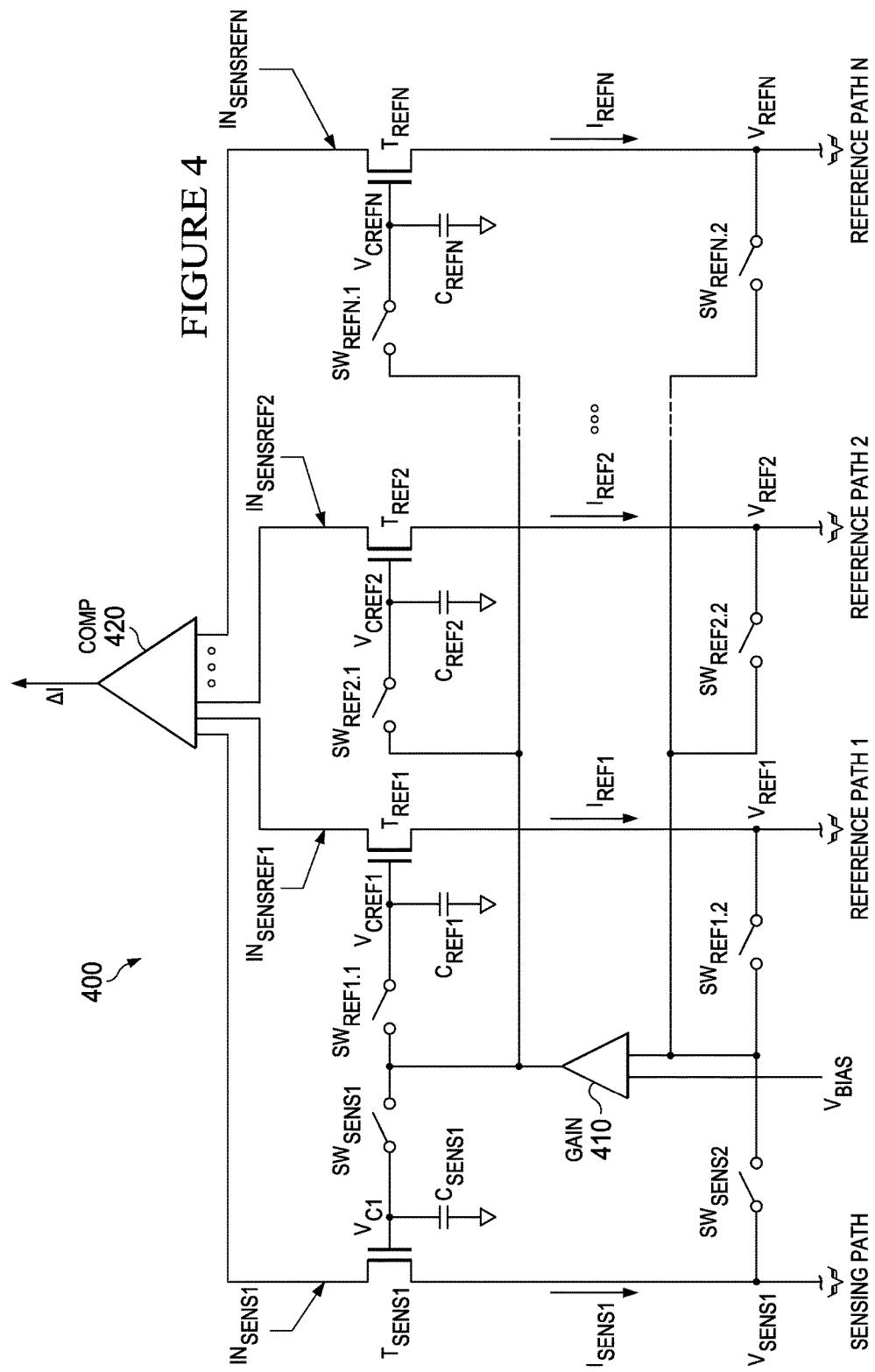

SENSING CIRCUIT WITH REDUCED BIAS CLAMP

PRIORITY CLAIM AND CROSS-REFERENCE

This application is a division of and claims the benefit of U.S. patent application Ser. No. 13/906,513, filed on May 31, 2013 and entitled "Sensing Circuit with Reduced Bias Clamp," which claims priority to U.S. Provisional Application No. 61/787,614, entitled "Sensing Circuit with Reduced Bias Clamp," filed on Mar. 15, 2013, which applications are hereby incorporated by reference herein in their entirety.

BACKGROUND

Semiconductor devices are used in a large number of electronic devices, such as computers, cell phones, and others. Semiconductor devices may include various types of components including transistors, integrated circuits, passive components and interconnects. The semiconductor industry continues to decrease the size of the components within semiconductor devices to improve power consumption, efficiency and speed of such devices. As semiconductor devices decrease in size, the components within the devices change to minimize the consumption of silicon area within the devices and improve performance.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 4 illustrates another sensing circuit in accordance with another embodiment.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments. Throughout the various views and illustrative embodiments, like reference numbers are used to designate like elements.

Embodiments discussed herein may provide a sensing circuit having a reduced bias offset or mismatch across sensing inputs for a comparator. The sensing inputs may share a gain device, which may be used to provide a clamping voltage for voltage controlled transistors on each of the sensing inputs. The shared gain device may reduce bias offset or mismatch between the sensing inputs for the comparator. Embodiments discussed herein may provide a sensing circuit that may be configured to provide sensing for read cells of various resistance-type memories such as, for example, magnetoresistive random access memory ("MRAM"), resistive RAM ("RRAM") and/or phase-change RAM ("PCRAM"). Manufacturing yield and power consumption may be improved by providing a sensing circuit in accordance with embodiments discussed herein.

Figure 1:
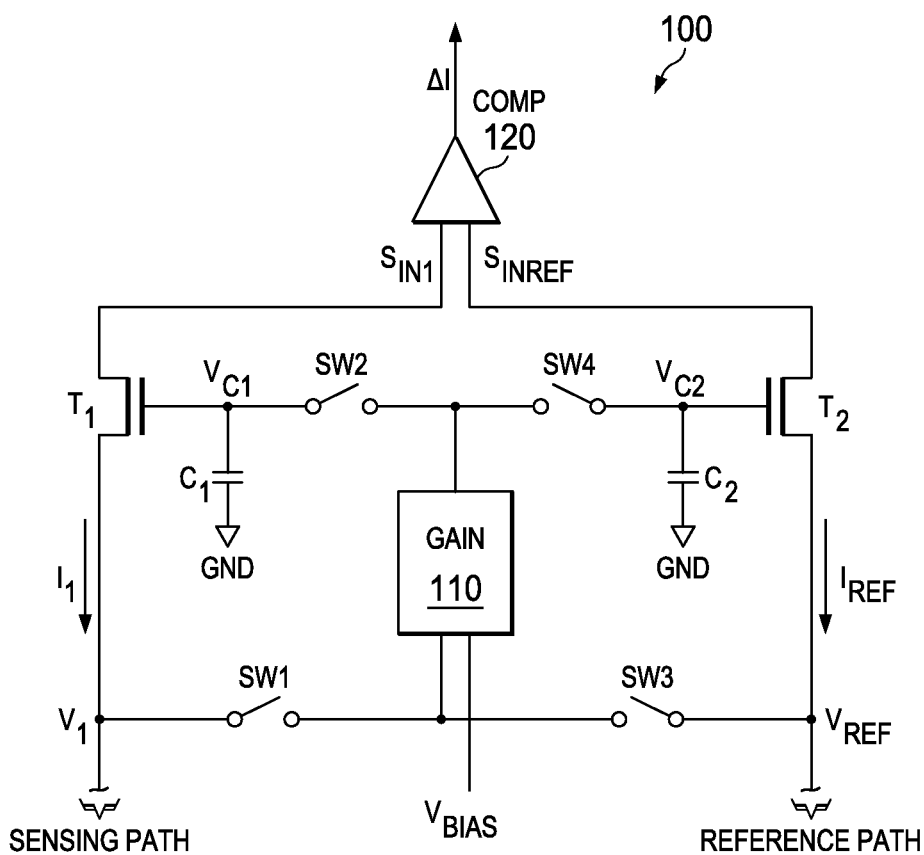
FIG. 1 illustrates a sensing circuit in accordance with an embodiment.

FIG. 1 illustrates a sensing circuit 100 in accordance with various embodiments. The sensing circuit 100 may include a sensing path and a reference path. The sensing path may provide a first sensing input $S_{IN1}$ to a comparator 120 and the reference path may provide a second sensing input $S_{INREF}$ to the comparator 120. The sensing path and the reference path may share a gain stage 110, which may receive a bias voltage $V_{BIAS}$. In some embodiments, the sensing path may sense changes for a bit line of a memory cell and a reference bit line may be provided to the reference path.

In some embodiments, the sensing path includes a first pair of switches SW1, SW2 (a first switch SW1 and a second switch SW2), a first clamping capacitor $C_1$ and a first transistor $T_1$. The sensing path may receive a first input voltage $V_1$ and may provide the first sensing input $S_{IN1}$ to the comparator 120. A first clamping voltage $V_{C1}$ may be applied to the first clamping capacitor $C_1$ from the gain stage 110. The first capacitor $C_1$ may have a first terminal coupled to a control terminal of the first transistor $T_1$ and a second terminal coupled to ground GND. The control terminal may be a gate terminal of the first transistor $T_1$. The first terminal of the first capacitor $C_1$ may further be coupled to a first terminal of the second switch SW2. A second terminal of the second switch SW2 may be coupled to an output of the gain stage 110. The first transistor $T_1$ may have a first terminal coupled to a first terminal of the first switch SW1, which may also receive the first input voltage $V_1$. A second terminal of the first switch SW1 may be coupled to a first input of the gain stage 110. The first transistor $T_1$ may have a second terminal coupled to the first sensing input $S_{IN1}$ of the comparator 120.

In some embodiments, the reference path includes a second pair of switches SW3, SW4 (a third switch SW3 and a fourth switch SW4), a second clamping capacitor $C_2$ and a second transistor $T_2$. The reference path may receive a reference input voltage $V_{REF}$ and may provide the second sensing input $S_{INREF}$ to the comparator 120. A second clamping voltage $V_{C2}$ may be applied to the second clamping capacitor $C_2$ from the gain stage 110. The second capacitor $C_2$ may have a first terminal coupled to a control terminal of the second transistor $T_2$ and a second terminal coupled to ground GND. The control terminal may be a gate terminal of the second transistor $T_2$. The first terminal of the second capacitor $C_2$ may further be coupled to a first terminal of the fourth switch SW4. A second terminal of the fourth switch SW4 may be coupled to the output of the gain stage 110. The second transistor $T_2$ may have a first terminal coupled to a first terminal of the third switch SW3, which may also receive the reference input voltage $V_{REF}$. A second terminal of the third switch SW3 may be coupled to the first input of the gain stage 110. The second transistor $T_2$ may have a second terminal coupled to the second sensing input $S_{INREF}$ of the comparator 120.

The sensing circuit 100 may operate in a charge mode and a sense mode. During the charge mode, the gain stage 110 may be used to charge the respective first and second clamping capacitors $C_1$, $C_2$ to the corresponding first and second clamping voltages $V_{C1}$, $V_{C2}$. The bias voltage $V_{BIAS}$ may be used by the gain stage 110 to provide a common clamping voltage for the sensing path and the reference at the start of the sense mode.

During the sense mode, the first transistor $T_1$ may be held on by the first clamping voltage $V_{C1}$ as applied by the first clamping capacitor $C_1$. The second transistor $T_2$ may be held on by the second clamping voltage $V_{C2}$ as applied by the clamping capacitor $C_2$. As the first input voltage $V_1$ may change for the sensing path, a first current $I_1$ through the sensing path may change, which may be registered at the first sensing input $S_{IN1}$ for the comparator 120. The reference voltage $V_{REF}$ may produce a reference current $I_{REF}$ which may be registered at the second input $S_{INREF}$ for the comparator 120. Changes in current between the sensing path and the reference path may be registered by the comparator 120, which may output the difference between the first current $I_1$ and the reference current $I_{REF}$ as represented by the output signal $\Delta I$. It is understood that the comparator 120 may also be used to measure voltage differences for the first and second path rather than current differences.

The charge mode may be operated in a serial charge mode or a partially parallel charge mode. In the serial charge mode, one of the paths, say, for example, the sensing path may be charged by closing the first pair of switches SW1 and SW2 and charging the first clamping capacitor $C_1$ to the first clamping voltage $V_{C1}$. The gain stage 110 and the feedback loop created by the closed first pair of switches SW1 and SW2 may clamp the first input voltage $V_1$ to $V_{BIAS}$, which may provide the first clamping voltage $V_{C1}$ to the first clamping capacitor $C_1$. After the first clamping capacitor $C_1$ may be charged, the first pair of switches SW1 and SW2 may be opened and the second pair of switches SW3 and SW4 may be closed to charge the second clamping capacitor $C_2$ to the second clamping voltage $V_{C2}$. The gain stage 110 and the feedback loop created by the second pair of switches SW3 and SW4 may clamp the reference voltage $V_{REF}$ to $V_{BIAS}$, which may provide the second clamping voltage $V_{C2}$ to the second clamping capacitor $C_2$.

In the partially parallel charge mode, gain side switches for both the sense path and the reference path may be closed in order to charge the clamping capacitors together. One of the switches on the input side of the gain stage 110 may be closed for a path to fully charge the clamping capacitor for that corresponding path to the clamping voltage. After the clamping capacitor is charged, the both switches for the charged path may be opened and the remaining switch on the input side of the gain stage 110 for the uncharged path may be closed to charge the remaining clamping capacitor to its clamping voltage. When the remaining clamping capacitor is charged, the switches for that path may be opened and the sensing circuit 100 may be operated in the sense mode.

An example may begin as follows, the second switch SW2 and the fourth switch SW4 may be closed. The third switch SW3 may be closed to charge the second clamping capacitor $C_2$ to the second clamping voltage $V_{C2}$. The gain stage 110 and the feedback loop created by the third and fourth switches SW3 and SW4 may clamp the reference voltage $V_{REF}$ to $V_{BIAS}$, which may provide the second clamping voltage $V_{C2}$ to the second clamping capacitor $C_2$. Then, the third and fourth switches SW3 and SW4 may be opened and the first switch SW1 may be closed to charge the first clamping capacitor to the first clamping voltage $V_{C1}$. The gain stage 110 and the feedback loop created by the first and second switches SW1 and SW2 may clamp the first input voltage $V_1$ to $V_{BIAS}$, which may provide the first clamping voltage $V_{C1}$ to the second first clamping capacitor $C_1$. When the first clamping capacitor $C_1$ is charged, the first and second switches SW1 and SW2 may be opened and the sensing circuit 100 may be operated in the sense mode.

The partially parallel charge mode may decrease the total charge time for charging the first and second clamping capacitors $C_1$, $C_2$ as compared to the serial charge mode, wherein each of the first and the second clamping capacitors $C_1$, $C_2$ are both charged from a lower charge potential in a serial manner. The tradeoff for the partially parallel charge mode, however, may be an increase in control circuitry to control the handshaking for the various switch configurations, as opposed to turning on and off a pair of switches for each path independently.

It is understood that either the sense path or the reference path may be charged in any order other than the orders described in the above examples without changing the scope of the embodiments of the sensing circuit 100 described herein.

In various embodiments, the first and second transistors may be NMOS and/or PMOS transistors, N-type or P-type bipolar junction transistors ("BJTs"), N-type or P-type field effect transistors ("FETs"), fin-type FETs, combinations thereof or the like. In various embodiments, any of the first, second, third, and/or fourth switches SW1-SW4 may be configured as transistor switches. In various embodiments, the gain stage 110 may be configured as a level shifter, an op-amp, an inverter, one or more NAND gates, one or more AND gates, one or more NOR gates, one or more OR gate, combinations thereof or the like. In an embodiment, the first and/or second clamping capacitors $C_1$, $C_2$ may be discrete devices or may be realized by changing the parasitic capacitance of the corresponding first and second transistors $T_1$, $T_2$.

Figure 2:
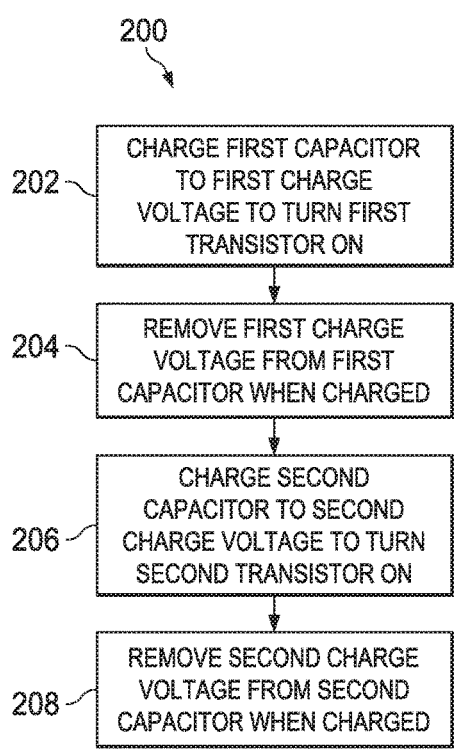
FIG. 2 illustrates a method for operating the sensing circuit of FIG. 1 in accordance with an embodiment.

FIG. 2 illustrates a method 200 for operating the sensing circuit 100 of FIG. 1 in accordance with various embodiments. As illustrated in FIG. 2, the method 200 may charge a first capacitor to a first charge voltage and set a first transistor to an on-state (block 202). The method 200 may set the first charge voltage using a first gain device. The method 200 may remove the first charge voltage from the first capacitor when the first capacitor is charged to the first charge voltage (block 204). The method 200 may charge a second capacitor to a second charge voltage and set a second transistor to an on-state (block 206). The method 200 may generate the second charge voltage using the first gain device. The method 200 may remove the second charge voltage from the second capacitor when the second capacitor is charged to the second charge voltage (208).

In some embodiments, the method 200 compares a first current from a first transistor and a second current from a second transistor to determine a difference between the first and second current. In some embodiments, the method 200 sets the first charge voltage using the first gain device, which may receive a first input voltage and a bias voltage. In some embodiments, the method 200 sets the second charge voltage using the first gain device, which may receive a second input voltage and the bias voltage. In some embodiments, the method 200 sets a first pair of switches to an on-state to charge the first capacitor to the first voltage. In other embodiments, the method 200 may set a second pair of switches to an on-state to charge the second capacitor to the second voltage.

Figure 3:
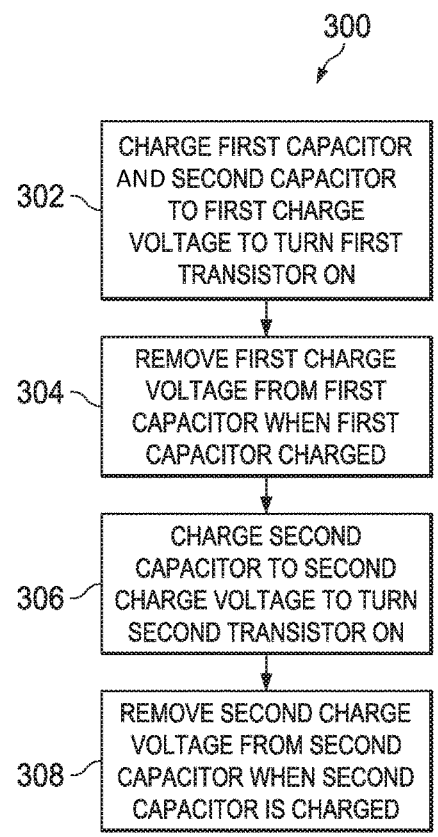
FIG. 3 illustrates another method for operating the sensing circuit of FIG. 1 accordance with an embodiment.

FIG. 3 illustrates another method 300 for operating the sensing circuit 100 of FIG. 1. As illustrated in FIG. 3, the method may charge a first capacitor and a second capacitor to a first charge voltage and set a first transistor to an on-state (block 302). The method 300 may set the first charge voltage using a first gain device. The method 300 may remove the first charge voltage from the first capacitor and the second capacitor when the first capacitor is charged to the first charge voltage (block 304). The method 300 may charge the second capacitor to a second charge voltage and set a second transistor to an on-state (block 306). The method 300 may set the second charge voltage using the first gain device. The method 300 may remove the second charge voltage from the second capacitor when the second capacitor is charged to the second charge voltage (block 308).

In an embodiment, the method 300 compares a first current from the first transistor and a second current from the second transistor to determine a difference between the first current and the second current. In an embodiment, the method 300 sets the first charge voltage using the first gain device, which receives a first input voltage and a bias voltage. In an embodiment, the method 300 sets the second charge voltage using the first gain device, which receives a second input voltage and the bias voltage.

In various embodiments, a sensing circuit may be configured to provide reduced bias offset or mismatch for multiple pairs of sensing lines, otherwise referred to herein as multi-path sensing. The multiple pairs of sensing lines may provide for sensing changes between one or more input voltages and one or more reference voltages. FIG. 4 illustrates another sensing circuit 400 in accordance with various multi-path sensing embodiments. The sensing circuit 400, as shown in FIG. 4, is configured to provide sensing between a sensing input voltage $V_{SENS1}$ and a plurality of reference input reference voltages $V_{REF1}$-$V_{REFN}$. It is understood, however, that the sensing circuit 400 in accordance with the present embodiments may be configured to provide sensing between one or more input voltages (not shown) and one or more reference voltages.

As shown in FIG. 4, the sensing circuit 400 includes a sensing path and a plurality of reference paths 1-N coupled to a comparator 420. The sensing path and each of the plurality of reference paths 1-N share a common gain device 410, which receives a bias voltage $V_{BIAS}$. The sensing path may provide a first sensing input $IN_{SENS1}$ to the comparator 420. The sensing path may include a pair of sensing path switches $SW_{SENS1}$, $SW_{SENS2}$ (a first switch $SW_{SENS1}$ and a second switch $SW_{SENS2}$), a sensing path clamping capacitor $C_{SENS1}$, and a sensing path transistor $T_{SENS1}$. The configuration of the components for the sensing path of FIG. 4 is similar to that as described for the sensing path of the sensing circuit 100 as shown in FIG. 1. Thus, a detailed description of the connections for the sensing path components ($SW_{SENS1}$, $SW_{SENS2}$, $T_{SENS1}$, $C_{SENS1}$) of the sensing circuit 400 will not be repeated for the sake of brevity.

Each of the plurality of reference paths 1-N for the sensing circuit 400 receives a corresponding reference input voltage $V_{REF1}$-$V_{REFN}$. A first reference path will be described in relation to the first reference input voltage $V_{REF1}$. The first reference path provides a first reference sensing input $IN_{SENSREF1}$ to the comparator 420 and includes a first pair of reference path switches $SW_{REF1.1}$, $SW_{REF1.2}$ (a first switch $SW_{REF1.1}$, and a second switch $SW_{REF1.2}$), a first reference path clamping capacitor $C_{REF1}$, and a first reference path transistor $T_{REF1}$. The configuration of the components for the first reference path of FIG. 4 is similar to that as described for the reference path of the sensing circuit 100 as shown in FIG. 1. Thus, a detailed description of the connections for the first reference path components ($SW_{REF1.1}$, $SW_{REF1.2}$, $T_{REF1}$, $C_{REF1}$) of the sensing circuit 400 will not be provided for the sake of brevity.

Each of the remaining reference paths 2-N may be configured in a manner similar to that as described for the first reference path and may share connections to the gain device 410 to reduce bias offset or mismatch between the various sensing paths for the comparator 420. For example, a second reference path may include a second pair of reference path switches $SW_{REF2.1}$, $SW_{REF2.2}$, a second reference path clamping capacitor $C_{REF2}$ and a second reference path transistor $T_{REF2}$. The second reference path receives a second reference voltage $V_{REF2}$ and provides a second reference sensing input $IN_{SENSREF2}$ to the comparator 420.

As shown in FIG. 4, the switch $SW_{REF2.1}$ has one terminal that shares a connection to an output of the gain device 410 and another terminal that is coupled to a first terminal of the second reference path clamping capacitor $C_{REF2}$ and is coupled to a gate terminal of the second reference path transistor $T_{REF2}$. The second reference path transistor $T_{REF2}$ has a first terminal coupled to the second reference sensing input $IN_{SENSREF2}$ to the comparator 420. The second reference path transistor $T_{REF2}$ has a second terminal coupled to an input of the gain device 410 through the switch $SW_{REF2.2}$.

Each of the remaining plurality of N reference paths may be configured in a manner similar to that described for the first and second reference paths wherein each of the remaining N reference paths may share similar connections to the gain device 410. In this manner, the configuration of the sensing circuit 400 may reduce bias offset or mismatch between the sensing path and each of the reference paths 1-N.

Similar to the sensing circuit 100 of FIG. 1, the sensing circuit 400 of FIG. 4 may operate a charge mode and a sense mode. During the charge mode, the gain device 410 charges the clamping capacitor $C_{SENS1}$ for the sensing path to a clamping voltage $V_{C1}$ and charges the clamping capacitors $C_{REF1}$-$C_{REFN}$ for each of the corresponding 1-N reference paths to $V_{CREF1}$-$V_{CREFN}$, respectively. The bias voltage $V_{BIAS}$ is used by the gain stage 410 to provide an approximately common clamping voltage for the sensing path and each of the corresponding 1-N reference paths at the start of a sense mode between the sense path and a corresponding reference path.

During a sense mode between the sensing path and a corresponding reference path, the sensing circuit 400 operates to detect changes between the sensing path and the corresponding reference path. The changes may be detected as current changes or voltage changes by the comparator 420. For example, the comparator 420 may receive and compare a current $I_{SENS1}$ at its input $IN_{SENS1}$ and a current $T_{REF1}$ at its input $IN_{SENSREF1}$. The comparator 420 outputs a difference between the currents as represented by the output signal ΔI. A control circuit (not shown) may be configured to cycle the sensing circuit 400 through the corresponding 1-N reference paths in order to compare corresponding differences (current or voltage) between the sensing input and a corresponding reference path.

In an embodiment, the sensing circuit 400 may be configured to provide for sensing between multiple sensing paths (not shown) and multiple reference paths. In an embodiment, a control circuit (not shown) may be configured to cycle or step the sensing circuit 400 through corresponding pairs of sensing path and reference path comparisons. The cycling or stepping may be performed serially or non-serially between the various comparisons. In this manner, the sensing circuit 400 may provide for sensing changes between one or more bit lines of a memory cell and one or more reference bit lines.

In another embodiment, the comparator 420 may be configured with a plurality of N current mirrors (not shown) to replicate the current $I_{SENS1}$ for the sensing path across the comparator 420 in order to perform parallel multipath comparisons between the sensing path current $I_{SENS1}$ and each of the N reference path currents $I_{REF1}$-$I_{REFN}$ in parallel. In such an embodiment, the comparator 420 may further be configured to provide N output difference currents ΔI corresponding to each of the multi-path comparisons. Parallel multipath sensing may reduce the total access time for performing multiple comparisons between multiple paths as opposed to cycling through multiple comparisons serially. The parallel multipath sensing may increase the complexity of the comparator configuration, but the time savings may outweigh the complexity costs for timing critical applications.

For the charge mode, the sensing path and each of the corresponding reference paths 1-N for the sensing circuit 400 may be charged in a serial or in a partially parallel manner similar to the charging as described for the sensing circuit 100 of FIG. 1. For example, in a serial charging mode, the clamping capacitor $C_{SENS1}$ for the sensing path is charged to the clamping voltage $V_{C1}$ by closing the sensing path switches $SW_{SENS1}$, $SW_{SENS2}$. Following the sensing path charging, for example, the first reference path clamping capacitor $C_{REF1}$ is charged to the clamping voltage $V_{CREF1}$ by closing the switches $SW_{REF1.1}$, $SW_{REF1.2}$ for the first reference path.

In another example, for partially parallel charging, the clamping capacitor $C_{SENS1}$ for the sensing path may be charged to the clamping voltage $V_{C1}$ by closing the sensing path switches $SW_{SENS1}$, $SW_{SENS2}$. The reference path switch $SW_{REF1.1}$ coupled to the output of the gain device 410 for the first reference path may be closed to provide a partial charge to the first reference path clamping capacitor $C_{REF1}$. After the clamping capacitor $C_{SENS1}$ is charged to the clamping voltage $V_{C1}$, the sensing path switches $SW_{SENS1}$, $SW_{SENS2}$ are opened and the reference path switch $SW_{REF1.2}$ closes to fully charge the first reference path capacitor $C_{REF1}$ to the clamping voltage $VC_{REF1}$. Any of the paths of the sensing circuit 400 may be charged using serial or partially parallel charge modes. For multipath sensing, the various clamping capacitors for the paths may all be charged and then sensing may be performed in a parallel or stepped manner as described above.

In various embodiments, the transistors for the sensing circuit 400 may be NMOS and/or PMOS transistors, N-type or P-type bipolar junction transistors ("BJTs"), N-type or P-type field effect transistors ("FETs"), fin-type FETs, combinations thereof or the like. In various embodiments, the switches for the sensing circuit 400 may be configured as transistor switches. In various embodiments, the gain stage 410 may be configured as a level shifter, an op-amp, an inverter, one or more NAND gates, one or more AND gates, one or more NOR gates, one or more OR gate, combinations thereof or the like. In an embodiment, the one or more of the clamping capacitors for the sensing circuit 400 may be discrete devices or may be realized by changing the parasitic capacitance of the transistor for a corresponding path.

In an embodiment, a circuit is provided. The circuit may include a gain device having a first input and a first output; a comparator having a first input, a second input and a first output; a first transistor and a second transistor. The first transistor may have a first control terminal. The first control terminal of the first transistor may be coupled to a first terminal of a first capacitor and a first terminal of a first switch. The first switch may have a second terminal coupled to the first output of the gain device. The first transistor may have a second terminal coupled to the first input of the comparator and a third terminal coupled to a first terminal of a second switch. The second switch may have a second terminal coupled to the first input of the gain device. The third terminal of the first transistor may be configured to receive a first voltage. The second transistor may have a first control terminal. The first control terminal of the second transistor may be coupled to a second capacitor and to a first terminal of a third switch. The third switch may have a second terminal coupled to the first output of the gain device. The second transistor may have a second terminal coupled to the second input of the comparator. The second transistor may have a third terminal coupled to a first terminal of a fourth switch. The fourth switch may have a second terminal coupled to the first input of the gain device. The third terminal of the first transistor may be configured to receive a second voltage.

In an embodiment, a method is provided. The method may include charging a first capacitor to a first charge voltage and setting a first transistor to an on-state, wherein the first charge voltage is generated by a first gain device; removing the first charge voltage from the first capacitor when the first capacitor is charged to the first charge voltage; charging a second capacitor to a second charge voltage and setting a second transistor to an on-state, wherein the second charge voltage is generated by the first gain device; and removing the second charge voltage from the second capacitor when the second capacitor is charged to the second charge voltage.

In an embodiment, another method is provided. The method may include charging a first capacitor and a second capacitor to a first charge voltage and setting a first transistor to an on-state, wherein the first charge voltage is generated by a first gain device; removing the first charge voltage from the first capacitor and the second capacitor when the first capacitor is charged to the first charge voltage; charging the second capacitor to a second charge voltage and setting a second transistor to an on-state, wherein the second charge voltage is generated by the first gain device; and removing the second charge voltage from the second capacitor when the second capacitor is charged to the second charge voltage.

In accordance with an embodiment, a circuit includes a gain device having a first input and a first output and a comparator having a first input, a second input and a first output. The circuit further includes a first transistor having a first control terminal, the first control terminal of the first transistor coupled to a first terminal of a first capacitor and a first terminal of a first switch, the first switch having a second terminal coupled to the first output of the gain device, the first transistor having a second terminal coupled to the first input of the comparator, the first transistor having a third terminal coupled to a first terminal of a second switch, the second switch having a second terminal coupled to the first input of the gain device. The circuit further includes a second transistor having a first control terminal, the first control terminal of the second transistor coupled to a second capacitor and to a first terminal of a third switch, the third switch having a second terminal coupled to the first output of the gain device, the second transistor having a second terminal coupled to the second input of the comparator, the second transistor having a third terminal coupled to a first terminal of a fourth switch, the fourth switch having a second terminal coupled to the first input of the gain device.

In accordance with another embodiment, a circuit includes a comparator having a plurality of input terminals and an output terminal, and a sensing path coupled between a first input terminal of the comparator and a sense input terminal. The sensing path includes a first transistor having a first source/drain terminal coupled to the first input terminal of the comparator and a second source/drain coupled to the sense input terminal, and a first capacitor having a first terminal coupled to a gate terminal of the first transistor. The sensing path further includes a first switch having a first terminal coupled to the gate terminal of the first transistor and the first terminal of the first capacitor, and a second switch having a first terminal coupled to the sense input terminal. The circuit further includes a first reference path coupled between a second input terminal of the comparator and a first reference input terminal. The first reference path includes a second transistor having a first source/drain terminal coupled to the second input terminal of the comparator and a second source/drain coupled to the first reference input terminal, and a second capacitor having a first terminal coupled to a gate terminal of the second transistor. The first reference path further includes a third switch having a first terminal coupled to the gate terminal of the second transistor and the first terminal of the second capacitor, and a fourth switch having a first terminal coupled to the first reference input terminal. The circuit further includes a gain device having a first input terminal, a second input terminal and an output terminal, the first input terminal of the gain device being coupled to a second terminal of the second switch and a second terminal of the fourth switch, the output terminal of the gain device being coupled to a second terminal of the first switch and a second terminal of the third switch.

In accordance with yet another embodiment, a circuit includes a comparator having a plurality of input terminals and an output terminal, a plurality of transistors, a first source/drain terminal of each of the plurality of transistors being coupled to a corresponding input terminal of the comparator, and a plurality of capacitors, a first terminal of each of the plurality of capacitors being coupled to a gate terminal of a corresponding transistor of the plurality of transistors. The circuit further includes a plurality of first switches, a first terminal of each of the plurality of first switches being coupled to the gate terminal of the corresponding transistor of the plurality of transistors, a plurality of second switches, a first terminal of each of the plurality of first switches being coupled to a second source/drain terminal of the corresponding transistor of the plurality of transistors, and a gain device having a first input terminal, a second input terminal and an output terminal, the first input terminal of the gain device being coupled to second terminals of the plurality of second switches, the output terminal of the gain device being coupled to second terminals of the plurality of first switches.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit comprising:
a gain stage having a first input and a first output;
a comparator having a first input, a second input and a first output;
a first transistor having a first control terminal, the first control terminal of the first transistor coupled to a first terminal of a first capacitor and a first terminal of a first switch, the first switch having a second terminal coupled to the first output of the gain stage, the first transistor having a second terminal coupled to the first input of the comparator, the first transistor having a third terminal coupled to a first terminal of a second switch, the second switch having a second terminal coupled to the first input of the gain stage; and
a second transistor having a first control terminal, the first control terminal of the second transistor coupled to a second capacitor and to a first terminal of a third switch, the third switch having a second terminal coupled to the first output of the gain stage, the second transistor having a second terminal coupled to the second input of the comparator, the second transistor having a third terminal coupled to a first terminal of a fourth switch, the fourth switch having a second terminal coupled to the first input of the gain stage.

2. The circuit of claim 1, wherein the gain stage is at least one of an operational amplifier, a level shifter and an inverter.

3. The circuit of claim 1, wherein the first transistor and the second transistor are either N-type transistors or P-type transistors.

4. The circuit of claim 1, further comprising:
a third transistor having a first control terminal, the first control terminal of the third transistor coupled to a third capacitor and to a first terminal of a fifth switch, the fifth switch having a second terminal coupled to the first output of the gain stage, the third transistor having a second terminal coupled to a third input of the comparator, the third transistor having a third terminal coupled to a first terminal of a sixth switch, the sixth switch having a second terminal coupled to the first input of the gain stage.

5. The circuit of claim 1, wherein a second terminal of the first capacitor and a second terminal of the second capacitor are coupled to ground.

6. The circuit of claim 1, wherein the third terminal of the first transistor is configured to receive a sense signal, and wherein the third terminal of the second transistor is configured to receive a reference signal.

7. The circuit of claim 1, wherein the gain stage is configured to provide a same voltage to the first control terminal of the first transistor and the first control terminal of the second transistor.

8. A circuit comprising:
a comparator having a plurality of input terminals and an output terminal;
a sensing path coupled between a first input terminal of the comparator and a sense input terminal, the sensing path comprising:
a first transistor having a first source/drain terminal coupled to the first input terminal of the comparator and a second source/drain coupled to the sense input terminal;
a first capacitor having a first terminal coupled to a gate terminal of the first transistor;

a first switch having a first terminal coupled to the gate terminal of the first transistor and the first terminal of the first capacitor; and a second switch having a first terminal coupled to the sense input terminal;

a first reference path coupled between a second input terminal of the comparator and a first reference input terminal, the first reference path comprising:

a second transistor having a first source/drain terminal coupled to the second input terminal of the comparator and a second source/drain coupled to the first reference input terminal;

a second capacitor having a first terminal coupled to a gate terminal of the second transistor;

a third switch having a first terminal coupled to the gate terminal of the second transistor and the first terminal of the second capacitor;

and a fourth switch having a first terminal coupled to the first reference input terminal;

and a gain stage having a first input terminal, a second input terminal and an output terminal, the first input terminal of the gain stage being coupled to a second terminal of the second switch and a second terminal of the fourth switch, the output terminal of the gain stage being coupled to a second terminal of the first switch and a second terminal of the third switch.

9. The circuit of claim 8, wherein the comparator is configured to receive a first input signal at the first input terminal from the sensing path and a second input signal at the second input terminal from the first reference path and output a difference between the first input signal and the second input signal at the output terminal of the comparator.

10. The circuit of claim 8, further comprising:

a second reference path coupled between a third input terminal of the comparator and a second reference input terminal, the second reference path comprising:

a third transistor having a first source/drain terminal coupled to the third input terminal of the comparator and a second source/drain coupled to the second reference input terminal;

a third capacitor having a first terminal coupled to a gate terminal of the third transistor;

a fifth switch having a first terminal coupled to the gate terminal of the third transistor and the first terminal of the third capacitor, a second terminal of the fifth switch being coupled to the first input terminal of the gain stage; and a sixth switch having a first terminal coupled to the second reference input terminal and a second terminal coupled to the first input terminal of the gain stage.

11. The circuit of claim 10, wherein the comparator is configured to receive a first input signal at the first input terminal from the sensing path and a second input signal at the third input terminal from the second reference path and output a difference between the first input signal and the second input signal at the output terminal of the comparator.

12. The circuit of claim 8, wherein the gain stage is configured to provide a same voltage to the first terminal of the first capacitor and the first terminal of the second capacitor.

13. The circuit of claim 8, wherein the first switch, the second switch, the third switch and the fourth switch are transistor switches.

14. The circuit of claim 8, wherein a parasitic capacitance of the first transistor is configured to act as the first capacitor, and wherein a parasitic capacitance of the second transistor is configured to act as the second capacitor.

15. A circuit comprising:

a comparator having a plurality of input terminals and an output terminal;

a plurality of transistors, a first source/drain terminal of each of the plurality of transistors being coupled to a corresponding input terminal of the comparator;

a plurality of capacitors, a first terminal of each of the plurality of capacitors being coupled to a gate terminal of a corresponding transistor of the plurality of transistors;

a plurality of first switches, a first terminal of each of the plurality of first switches being coupled to the gate terminal of the corresponding transistor of the plurality of transistors;

a plurality of second switches, a first terminal of each of the plurality of first switches being coupled to a second source/drain terminal of the corresponding transistor of the plurality of transistors; and a gain stage having a first input terminal, a second input terminal and an output terminal, the first input terminal of the gain stage being coupled to second terminals of the plurality of second switches, the output terminal of the gain stage being coupled to second terminals of the plurality of first switches.

16. The circuit of claim 15, wherein second terminals of the plurality of capacitors are coupled to ground.

17. The circuit of claim 15, wherein the plurality of transistors comprises either N-type transistors or P-type transistors.

18. The circuit of claim 15, wherein the gain stage is configured to receive a bias voltage at the second input terminal of the gain stage and provide a same voltage to the gate terminals of the plurality of transistors.

19. The circuit of claim 15, wherein the gain stage is configured to receive a bias voltage at the second input terminal of the gain stage and provide a same voltage to the first terminals of the plurality of capacitors.

20. The circuit of claim 15, wherein the comparator is configured to receive output signals form the plurality of transistors and output a difference of a first output signal and any other output signal at the output terminal of the comparator.

* * * * *